United States Patent
Xu et al.

(10) Patent No.: US 6,238,528 B1
(45) Date of Patent: May 29, 2001

(54) PLASMA DENSITY MODULATOR FOR IMPROVED PLASMA DENSITY UNIFORMITY AND THICKNESS UNIFORMITY IN AN IONIZED METAL PLASMA SOURCE

(75) Inventors: Zheng Xu, Foster City; Fusen Chen, Cupertino; Jianming Fu, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/170,874

(22) Filed: Oct. 13, 1998

(51) Int. Cl.[7] .................................................. C23C 14/34
(52) U.S. Cl. ............................ 204/192.12; 204/298.06; 204/298.12; 204/298.16; 204/298.17; 204/298.18; 204/298.19; 204/298.2
(58) Field of Search ...................... 204/192.12, 298.06, 204/298.08, 298.12, 298.16, 298.17, 298.18, 298.19, 298.2, 298.26

(56) References Cited

U.S. PATENT DOCUMENTS

| | | | |
|---|---|---|---|
| 3,594,301 | 7/1971 | Bruch | 204/298.26 |
| 4,336,118 | 6/1982 | Patten et al. | 204/192.12 |

(List continued on next page.)

FOREIGN PATENT DOCUMENTS

| | | |
|---|---|---|
| 0520519 | 6/1992 | (EP) . |
| 0607797 | 1/1994 | (EP) . |
| 0 774 886 A1 * | 5/1997 | (EP) . |
| 0807954 | 11/1997 | (EP) . |
| 0837490 | 4/1998 | (EP) . |
| 2162365 | 1/1986 | (GB) . |
| 2231197 | 11/1990 | (GB) . |
| 61-190070 | 2/1985 | (JP) . |
| 5263234 | 10/1993 | (JP) . |
| 6232055 | 8/1994 | (JP) . |
| 59190363 | 10/1994 | (JP) . |
| 6283470 | 10/1994 | (JP) . |
| 8153712 | 11/1994 | (JP) . |
| 8288259 | 4/1995 | (JP) . |
| 7176398 | 7/1995 | (JP) . |
| 7176399 | 7/1995 | (JP) . |
| 8606923 | 11/1986 | (WO) . |
| 9852207 | 11/1998 | (WO) . |

OTHER PUBLICATIONS

Matsuoka, et al. "Dense Plasma Production and Film Deposition by New High–Rate Sputtering Using an Electric Mirror," J. Va Technol. A 7(4), Jul./Aug. 1989, pp. 2652–2657.

(List continued on next page.)

*Primary Examiner*—Rodney McDonald
(74) *Attorney, Agent, or Firm*—Konrad, Raynes & Victor LLP

(57) ABSTRACT

A plasma chamber in a semiconductor fabrication system improves the uniformity of a high density plasma by optimizing a ratio of RF power from a first coil, surrounding and inductively coupled into the high density plasma, to RF power from a second coil, positioned above a central region and inductively coupled into the high density plasma. It has also been found that an increase in RF power supplied to the second coil positioned above the central region relative to RF power suppled to the first coil surrounding the high density plasma tends to increase the relative density of the plasma toward the center of the high density plasma. It is believed that RF power supplied to the second coil positioned above the central region substrate tends to add more electrons into the central region of the high density plasma to compensate for electrons recombining with plasma ions. A balance can thus be struck between RF power supplied to the first and second coils to increase plasma uniformity in the high density plasma, which may cause an increase in the uniformity of ionization of the sputtered target material atoms by the high density plasma.

30 Claims, 5 Drawing Sheets

U.S. PATENT DOCUMENTS

| | | | |
|---|---|---|---|
| 4,362,632 | 12/1982 | Jacob | 422/186.04 |
| 4,416,760 | 11/1983 | Turner | 204/298.11 |
| 4,622,121 | 11/1986 | Wegmann et al. | 204/298.18 |
| 4,626,312 | 12/1986 | Tracy | 156/345 |
| 4,661,228 | 4/1987 | Mintz | 204/192.25 |
| 4,842,703 | 6/1989 | Class et al. | 204/192.12 |
| 4,865,712 | 9/1989 | Mintz | 204/298.16 |
| 4,871,421 | 10/1989 | Ogle et al. | 438/710 |
| 4,918,031 | 4/1990 | Flamm et al. | 438/695 |
| 4,925,542 | 5/1990 | Kidd | 427/531 |
| 4,941,915 | 7/1990 | Matsuoka et al. | 204/192.12 |
| 4,948,458 | 8/1990 | Ogle | 438/729 |
| 4,990,229 | 2/1991 | Campbell et al. | 204/298.06 |
| 4,999,096 | 3/1991 | Nihei et al. | 204/192.3 |
| 5,122,251 | 6/1992 | Campbell et al. | 204/298.06 |
| 5,146,137 | 9/1992 | Gesche et al. | 315/111.21 |
| 5,178,738 | 1/1993 | Ishikawa et al. | 204/192.11 |
| 5,178,739 | 1/1993 | Barnes et al. | 204/192.12 |
| 5,231,334 | 7/1993 | Paranjpe | 315/111.21 |
| 5,234,529 | 8/1993 | Johnson | 156/345 |
| 5,234,560 | 8/1993 | Kadlec et al. | 204/192.12 |
| 5,241,245 | 8/1993 | Barnes et al. | 315/111.41 |
| 5,280,154 | 1/1994 | Cuomo et al. | 219/121.52 |
| 5,304,279 | 4/1994 | Coultas et al. | 156/345 |
| 5,346,578 | 9/1994 | Benzing et al. | 156/345 |
| 5,361,016 | 11/1994 | Ohkawa et al. | 315/111.41 |
| 5,366,585 | 11/1994 | Robertson et al. | 216/67 |
| 5,397,962 | 3/1995 | Moslehi | 315/111.51 |
| 5,401,350 | 3/1995 | Patrick et al. | 156/345 |
| 5,404,079 | 4/1995 | Ohkuni et al. | 315/111.81 |
| 5,417,834 | 5/1995 | Latz | 204/298.11 |
| 5,418,431 | 5/1995 | Williamson et al. | 315/111.51 |
| 5,429,070 | 7/1995 | Campbell et al. | 118/723 R |
| 5,429,995 | 7/1995 | Nishiyama et al. | 438/788 |
| 5,430,355 | 7/1995 | Paranjpe | 315/111.21 |
| 5,431,799 | 7/1995 | Mosely et al. | 204/298.06 |
| 5,464,518 | 11/1995 | Sieck et al. | 204/192.12 |
| 5,503,676 | 4/1996 | Shufflebotham et al. | 118/723 MR |
| 5,560,776 | 10/1996 | Sugai et al. | 118/723 AN |
| 5,573,595 | 11/1996 | Dible | 118/723 MP |
| 5,639,357 | 6/1997 | Xu | 204/192.3 |
| 5,707,498 | 1/1998 | Ngan | 204/192.12 |
| 6,077,402 | 6/2000 | Hong et al. | 204/192.12 |

OTHER PUBLICATIONS

U.S. application No. 08/857,719, filed May 16, 1997 (Atty. Dkt. 1752/5331).

U.S. application No. 09/064,355, filed Apr. 22, 1998 (Atty. Dkt. 1901/5462).

U.S. application No. 09/362,917, filed Jul. 27, 1999 (Atty. Dkt. 2326/7005).

U.S. application No. 09/129,109, filed Aug. 4, 1998 (Atty. Dkt. 1732/5319).

J. Hopwood et al., "Mechanisms for Highly Ionized Magnetron Sputtering," *J. Appl. Phys.*, vol. 78, pp. 758–765, 1995.

N. Jiwari et al., "Helicon wave plasma reactor employing single–loop antenna," *J. of Vac. Sci. Technol.*, A 12(4), pp. 1322–1327, Jul./Aug. 1994.

S.M. Rossnagel et al., "Magnetron Sputter Deposition with High Levels of Metal Ionization," *Appl. Phys. Lett.*, vol. 63, pp. 3285–3287, 1993.

S.M. Rossnagel, "Directional and Ionized Sputter Deposition for Microelectronics Applications," *Proc. of 3rd ISSP (Tokyo)*, pp. 253–260, 1995.

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built–in High Frequency Coil Type Sputtering Apparatus," *J. Vac. Sci. Technol.*, vol. A7, pp. 151–158, 1989.

U.S. patent application serial No. 08/853,024, filed May 8, 1997 (Atty. Dk. 1186.P1/PVD/DV).

U.S. patent application serial No. 08/851,946, filed May 6, 1997 (Atty. Dk. 1390.C1/PVD/DV).

U.S. patent application serial No. 09/049,839, filed Mar. 27, 1998 (Atty. Dk. 938.D1).

U.S. patent application serial No. 09/049,276, filed Mar. 27, 1998 (Atty. Dk. 938.D2).

PCT/US99/23015 Written Opinion issued Sep. 26, 2000 (Atty Dkt 1557/5117).

* cited by examiner

PLASMA DENSITY MODULATOR FOR IMPROVED PLASMA DENSITY UNIFORMITY AND THICKNESS UNIFORMITY IN AN IONIZED METAL PLASMA SOURCE

FIELD OF THE INVENTION

The present invention relates to plasma generators, and more particularly, to a method and apparatus for generating a plasma to sputter deposit a layer of material in the fabrication of semiconductor devices.

BACKGROUND OF THE INVENTION

Plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created adjacent to the target impact the surface of the target to dislodge, i.e., "sputter" material from the target. The sputtered materials are then transported and deposited on the surface of the semiconductor wafer.

Sputtered material has a tendency to travel in straight line paths from the target to the substrate on which they are being deposited, at angles which are oblique to the surface of the substrate. As a consequence, materials deposited in etched trenches and holes of semiconductor devices with a high depth to width aspect ratio can bridge over the opening causing undesirable cavities in the deposition layer. To prevent such cavities, the sputtered material can be redirected into substantially vertical paths between the target and the substrate by negatively charging the substrate to position vertically oriented electric fields adjacent the substrate if the sputtered material is sufficiently ionized by the plasma. However, material sputtered in a low density plasma often has an ionization degree of less than 10% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance-matching network, such that the coil acts as the first windings of a transformer. The plasma acts as a single turn second winding of a transformer.

Ionized physical vapor deposition (PVD) typically requires the chamber to be operated at a relatively high pressure. As a result, the frequency of collisions between the plasma ions and the deposition material atoms is increased and the scattering of the deposition atoms towards the shields is likewise increased. This scattering of the deposition atoms typically causes the thickness of the deposition layer on the substrate to be thicker on that portion of the substrate aligned with the center of the target and thinner in the outlying regions. Such non-uniformity of deposition is often undesirable in the fabrication of semiconductor devices.

SUMMARY OF THE PREFERRED EMBODIMENTS

It is an object of the present invention to provide an improved method and apparatus for generating a plasma within a chamber and for sputter-depositing a layer which obviate, for practical purposes, the above-mentioned limitations.

These and other objects and advantages are achieved by, in accordance with one aspect of the invention, a plasma-generating apparatus that improves the uniformity of a high density plasma including, for example, molecular nitrogen ($N_2$) and argon (Ar), by optimizing a ratio of RF power from a first coil, surrounding and inductively coupled into the high density plasma, to RF power from a second coil, positioned closer to the high density plasma. An increase in RF power supplied to the second coil positioned above the central region relative to RF power suppled to the first coil surrounding the high density plasma can increase the relative density of the plasma toward the center of the high density plasma. It is believed that RF power supplied to the second coil positioned above the central region of the substrate tends to add more electrons into the central region of the high density plasma to compensate for electrons recombining with plasma ions. A balance can thus be struck between RF power supplied to the first and second coils to increase plasma uniformity in the high density plasma, which may cause an increase in the uniformity of ionization of the sputtered target material atoms by the high density plasma.

In a preferred embodiment, an apparatus for energizing a plasma within a semiconductor fabrication system to sputter material from a target onto a substrate may include a semiconductor fabrication chamber having a plasma generation region adjacent the target. A first coil carried by the chamber is positioned surrounding the plasma generation region to couple energy into the plasma generation region. It is believed that the plasma generated by the first coil not only ionizes the sputtered material but also contributes to the total number of ions impacting the target. Moreover, it is believed that the ions produced by the inductively coupled plasma tend to etch preferentially the periphery of a target as compared to the center of a target. Hence, by shaping the target to be like the frustrum of a hollow cone without a center, and by adjusting the ratio of power supplied to the first coil to power supplied to the target, the amount of material deposited on the periphery of the substrate relative to the center of the substrate can similarly be adjusted so as to achieve an improved degree of uniformity of deposition of the target material sputtered onto the substrate.

A second coil carried by the chamber is positioned above a central region of the plasma generation region to couple energy into the plasma generation region. It is believed that the plasma generated by the second coil replenishes the supply of electrons in the high density plasma to compensate for the loss of electrons to various recombination processes. Moreover, it is believed that the inductively coupled plasma produced by the first coil tends to be most dense preferentially at the periphery of the high density plasma, whereas it is believed that the inductively coupled plasma produced by the second coil tends to be most dense preferentially at the central region of the high density plasma. Hence, by adjusting the ratio of power supplied to the first and second coils, the density profile of the high density plasma can be adjusted so as to achieve an improved degree of uniformity of density of the high density plasma.

DETAILED DESCRIPTION OF THE DRAWINGS

Figure 1:
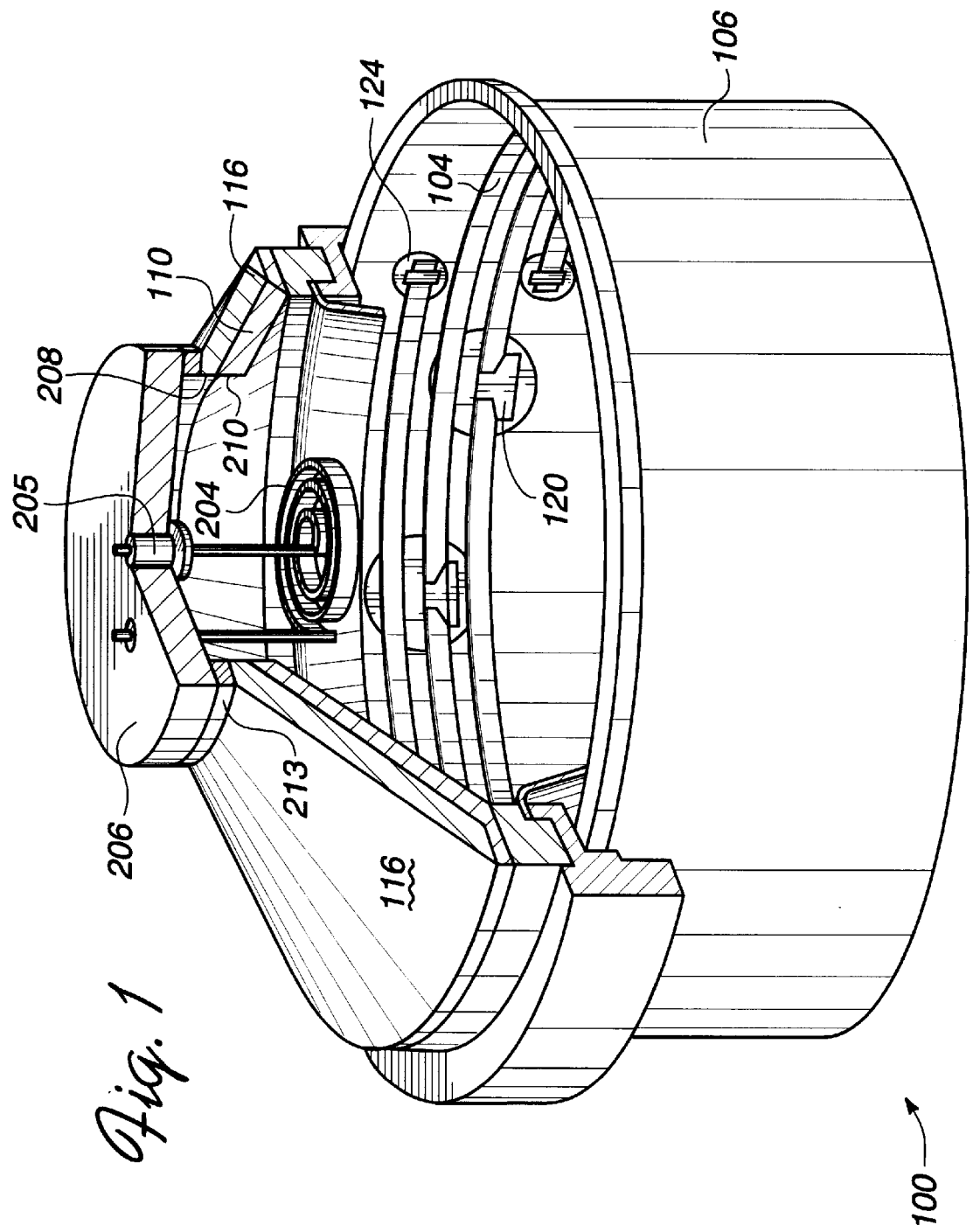
FIG. 1 is a perspective, partial cross-sectional view of a plasma-generating chamber in accordance with an embodiment of the present invention.
Figure 2:
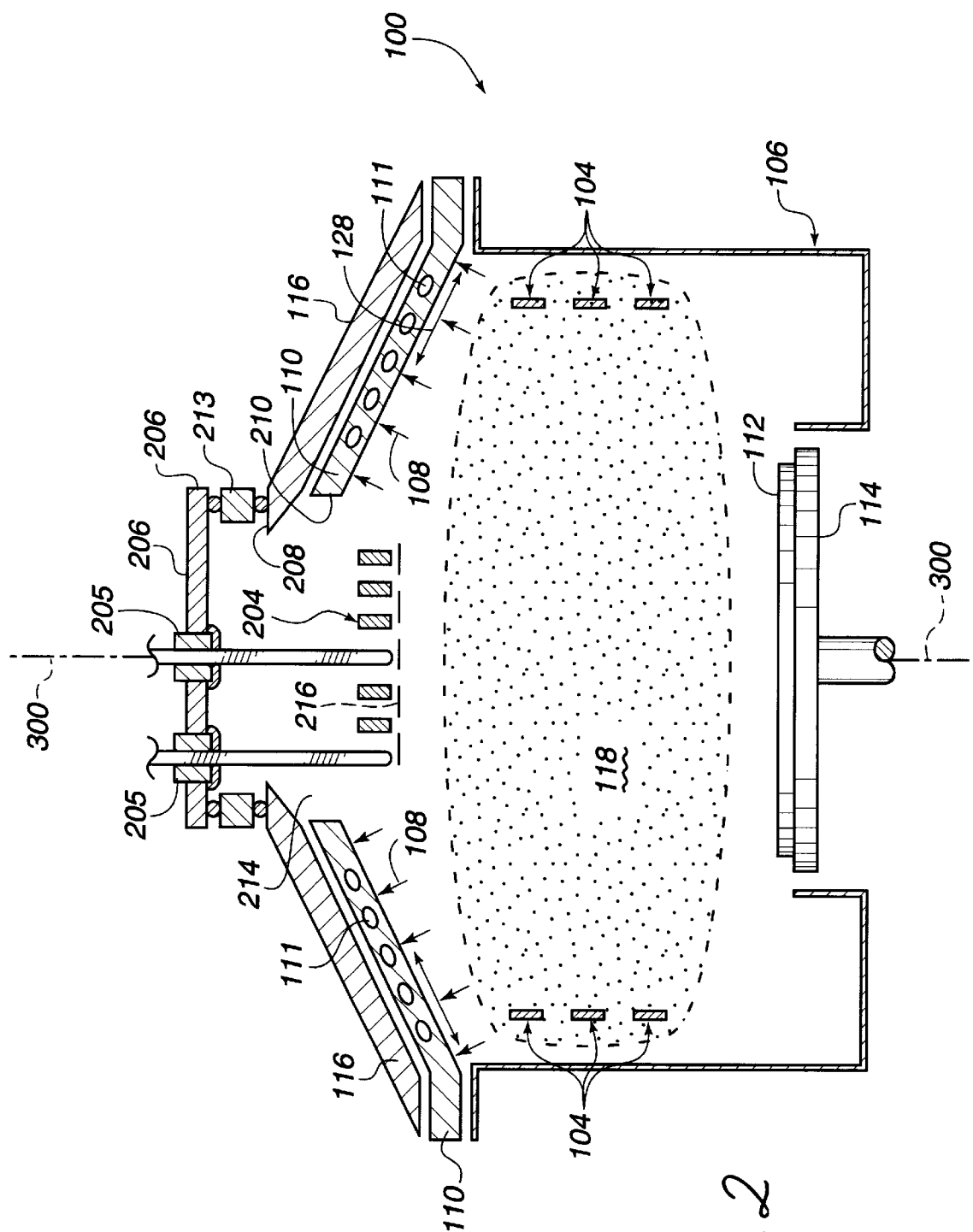
FIG. 2 is a schematic cross-sectional diagram of the plasma-generating chamber of FIG. 1.
Figure 3:
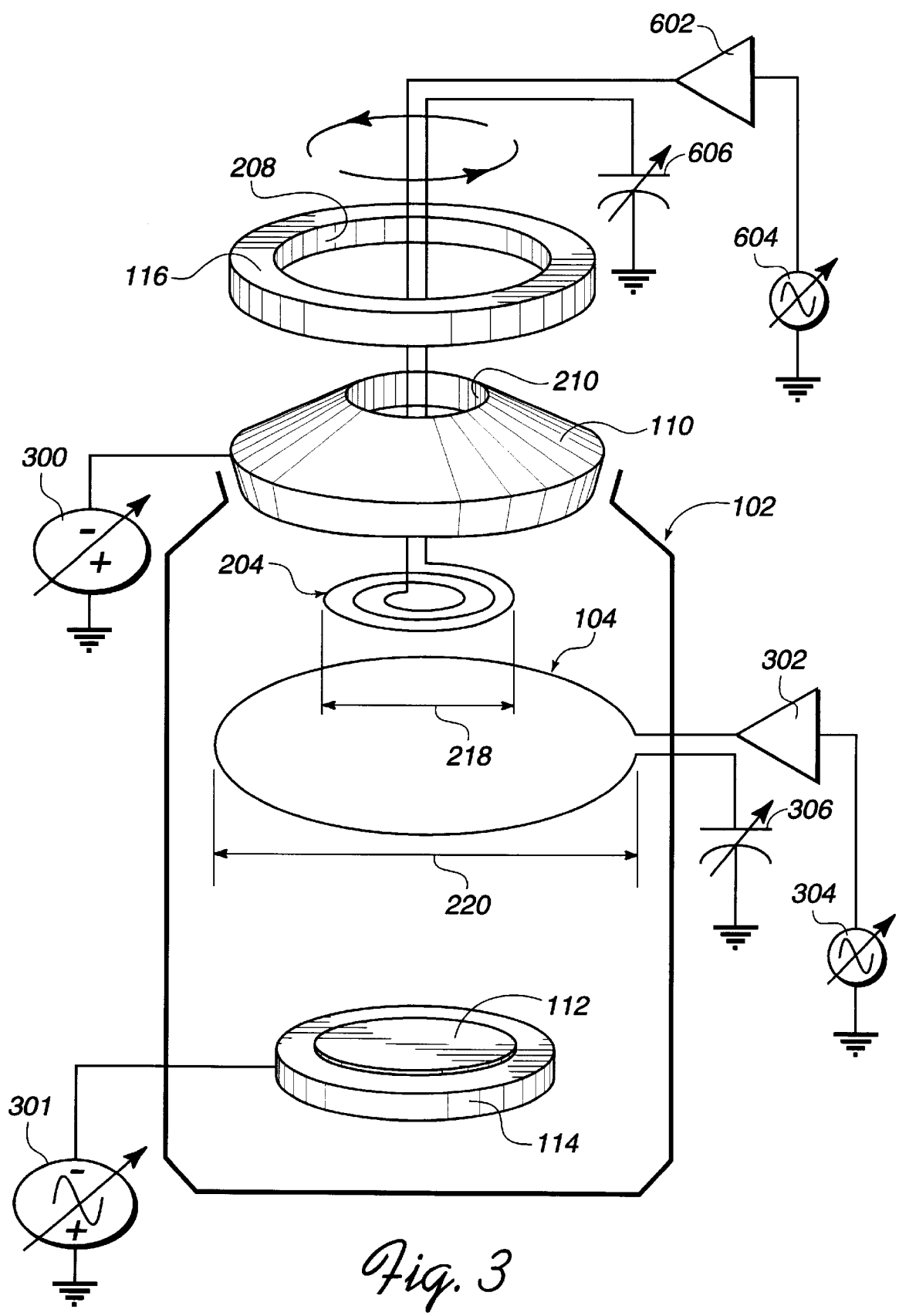
FIG. 3 is a schematic diagram of the electrical interconnections to the plasma-generating chamber of FIGS. 1–2.

Referring first to FIGS. 1–3, a plasma generator in accordance with an embodiment of the present invention comprises a substantially cylindrical plasma chamber 100 which is received in a vacuum chamber 102 (shown schematically in FIGS. 2 and 3). The plasma chamber 100 of this embodiment has a first coil 104 which is a multi-turn coil carried internally of the vacuum chamber 102 walls by a chamber shield 106. The chamber shield 106 protects the interior walls of the vacuum chamber 102 from the material being deposited within the interior of the plasma chamber 100. Radio frequency (RF) energy is radiated from the coil 104 into the interior of the plasma chamber 100 to energize a plasma for ionizing the sputtered material. As explained in greater detail below, in accordance with one aspect of the present invention, a second coil 204 is positioned closer to the plasma center to energize the plasma to produce a plasma having a more uniform density.

When gas, at a subatmospheric pressure, is maintained within the vacuum chamber 102 and RF power is coupled thereto from the coil 104, a plasma is formed of the gas. The plasma provides ions of the gas atoms to enable an ion flux 108 (FIG. 2) to strike a negatively biased target 110 positioned at one end of the plasma chamber 100. The target 110 may be shaped like the frustrum of a hollow cone, as shown in FIGS. 1–3. Additionally, the target 110 may have other configurations, such as a planar disk-like appearance. The target 110 may also be cooled by water circulating through channels 111 provided within the target 110. The plasma ions eject material from the target 110 onto a substrate 112 which may be a wafer or other workpiece supported by a pedestal 114, preferably at the bottom of the plasma chamber 100 in a facing relationship with the target 110. A rotating magnetron assembly 116 (shown schematically in FIGS. 2 and 3) may be provided behind the target 110, i.e., preferably outside of the plasma generation region, to produce magnetron magnetic fields that sweep over the face of the target 110 to promote the desired patterns of ion formation and erosion by sputtering of the target 110. In some applications, the magnetron may be omitted.

As set forth above, radio frequency (RF) energy is radiated from the coil 104 and the coil 204 into the interior of the plasma chamber 100, which energizes a plasma 118 (FIG. 2) within the plasma chamber 100. Deposition material sputtered from the target is ionized by the plasma 118 so that the ionized material may be attracted to the substrate 112 by electric fields in the vicinity of the substrate 112. These electric fields are oriented so as to direct the ionized deposition material in directions generally orthogonal to the surface of the substrate 112 to improve the step coverage of vias, channels and other high aspect ratio structures.

Figure 6:
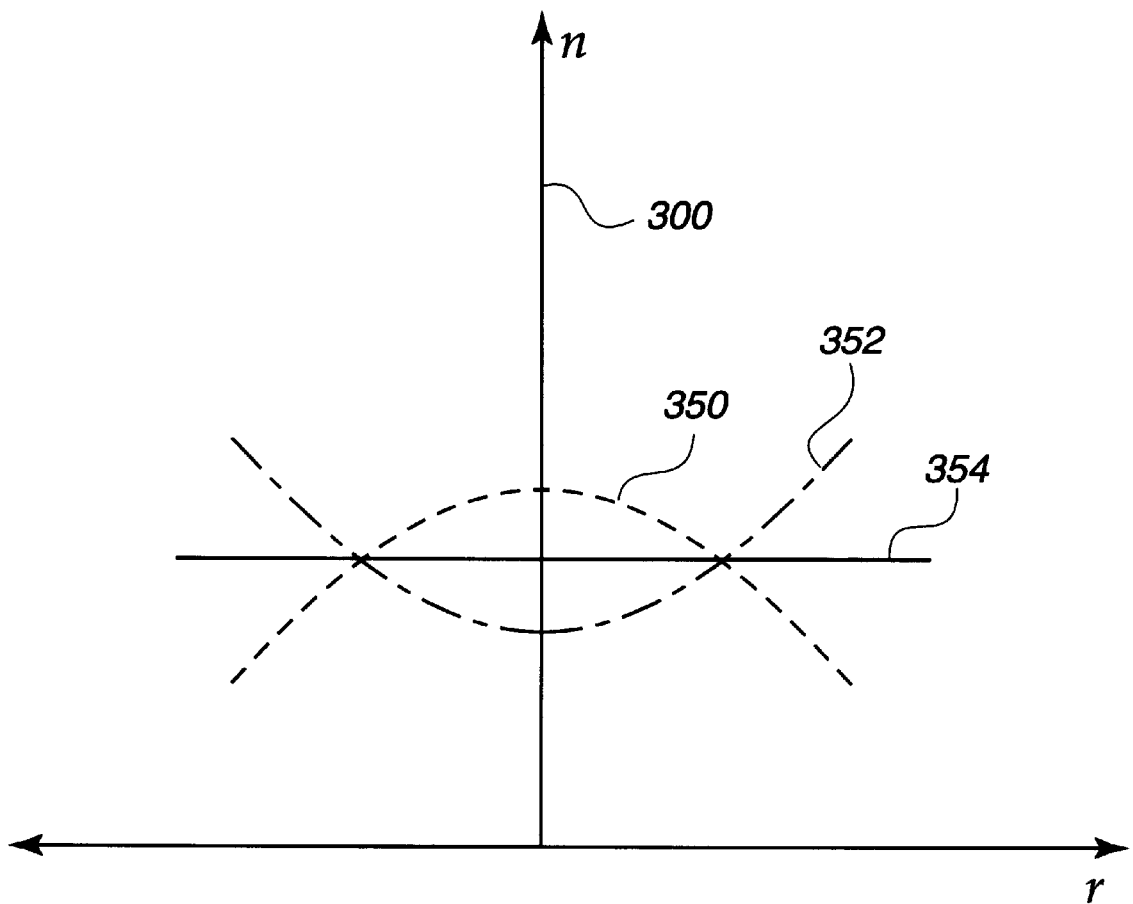
FIG. 6 is a chart depicting the respective plasma density profiles for the plasma-generating chambers of FIGS. 1–2 due to the RF power applied to the first and second coils.

In the illustrated embodiment, the target 110, coils 104 and 204, and the workpiece 112, are co-axially aligned as represented by axis 300 in FIGS. 2 and 6. As will be explained in greater detail below, in accordance with one aspect of the present invention, it is believed that an increase in RF power applied to the coil 204 and coupled into the high density plasma 118 within the plasma chamber 100, relative to RF power applied to the coil 104 and also coupled into the high density plasma 118 within the plasma chamber 100, tends to increase the density of the central portion of the high density plasma 118 (represented graphically as line 350 in FIG. 6). Conversely, it is believed that an increase in RF power supplied to the coil 104 relative to RF power supplied to the coil 204 tends to increase the peripheral density of the high density plasma 118 (represented graphically as line 352 in FIG. 6). For a nitrogen/argon ($N_2$/Ar) plasma, it is believed that the agitation of the electrons in the high density plasma 118 decreases with increasing distance from the coil radiating the RF power. Consequently, by tuning the ratio of RF power supplied to the coil 104 to the RF power supplied to the coil 204, a balance can thus be struck between the electron density at the center and the periphery of the high density plasma 118 to increase density uniformity of the high density plasma 118.

Figure 5:
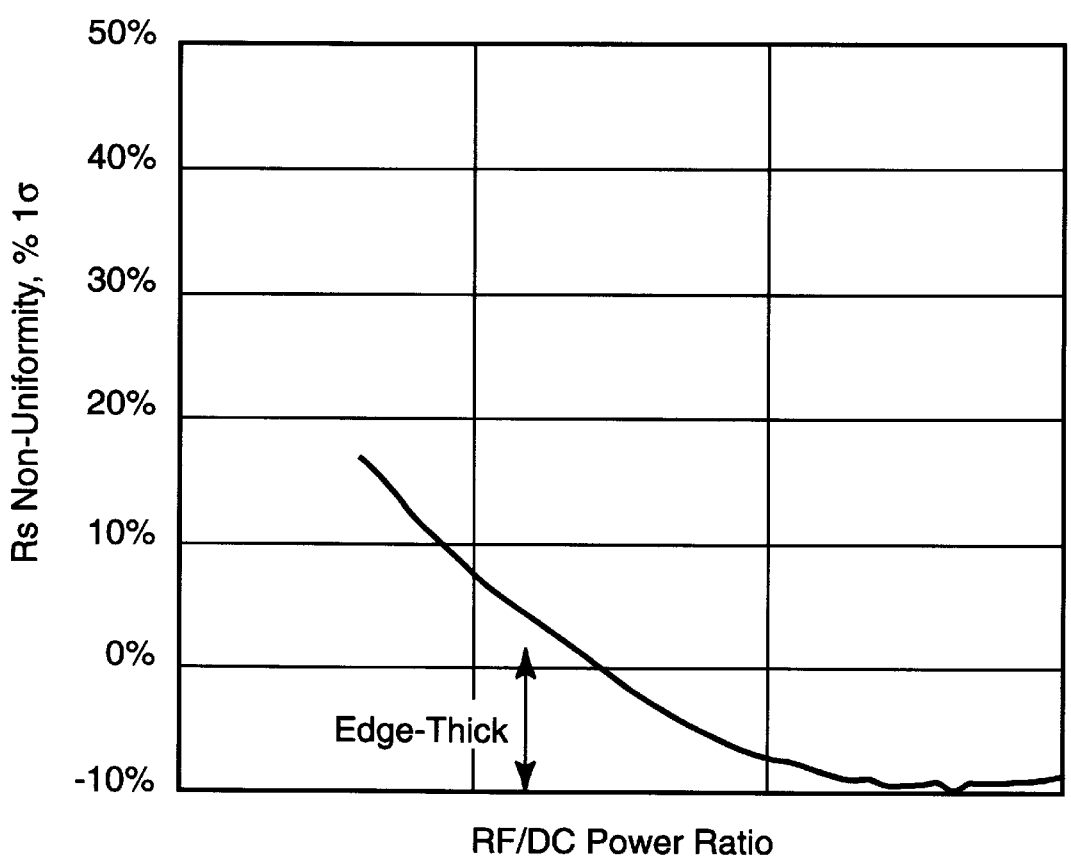
FIG. 5 is a graph depicting the effect on deposition uniformity of the ratio of the RF power applied to the coils relative to the DC power bias of the target.

It is believed that an increase in RF power applied to the coil 104 and coupled into the high density plasma 118 within the plasma chamber 100, relative to DC power supplied to bias the target 110 negatively, tends to increase the thickness of target material deposited toward the periphery of the substrate 112 (shown schematically in FIG. 5). Conversely, it has also been found that a decrease in RF coil power relative to DC target power tends to increase the thickness of target material deposited toward the center of the substrate 112 (also shown schematically in FIG. 5). It is believed that the ion flux 108 sputtering the target 110 is generated not only by the action of the magnetron 116 but also by the high density plasma 118 created to ionize the sputtered deposition material. As a consequence, by controlling the RF power applied to the separate coils 104, 204, plasma density distribution across the target, may be controlled, and hence the sputtering of the target may be controlled in accordance with that distribution.

For example, that portion of the ion flux 108 contributed by the plasma 118 can be distributed so as to more preferentially sputter regions toward the periphery of the target 110 as compared regions toward the center of the target 110. Materials sputtered from regions toward the periphery of the target 110 have a tendency to deposit more heavily on the periphery of the substrate 112 as compared to the center of the substrate 112. Conversely, materials sputtered by that portion of the ion flux 108 which is generated by the action of the magnetron 116 have a tendency to deposit more heavily in the center of the substrate 112. Consequently, by tuning not only the ratio of RF power applied to the coil 104 to the DC power applied to the target 110 but also the RF power applied to the second coil 204, a uniform plasma density and a more uniform deposition thickness may be achieved simultaneously. Accordingly, a more uniform deposition into the bottoms of via holes (from hole to hole) can also be achieved.

FIG. 3 includes a schematic representation of the electrical connections of the plasma-generating apparatus of this illustrated embodiment. To sputter target material onto the substrate 112, the target 110 is preferably negatively biased by a variable DC power source 300 to attract the ions of the ion flux 108. In the same manner, the pedestal 114 may be negatively biased by an RF (or AC) power source 301 to bias the substrate 112 negatively to attract the ionized deposition material to the substrate 112. Alternatively, the pedestal 114 may be biased to a negative DC bias by a variable DC power source. In yet another alternative, an external biasing of the substrate 112 may be omitted. For example, the substrate 112 may develop a self-biasing of between about −5 V to about −10 V relative to the ground, even in the absence of any external biasing.

One end of the coil 104 is coupled to an RF source such as the output of an amplifier and matching network 302, the input of which is coupled to an RF generator 304. The other end of the coil 104 is coupled to ground, preferably through a blocking capacitor 306, which may be a variable capacitor.

The coil 104 in the embodiment of FIG. 1 is a ribbon-shaped coil which is carried on the chamber shield 106 by a plurality of coil standoffs 120 (FIG. 1) which electrically insulate the coil 104 from the supporting chamber shield 106. The plasma generation area 118 is effectively surrounded by the circular coil 104. The insulating coil standoffs 120 have an internal labyrinth structure which permits repeated deposition of conductive materials from the target 110 onto the coil standoffs 120 while preventing the formation of a complete conducting path of deposited material from the coil 104 to the chamber shield 106. Such a completed conducting path is undesirable because it could short the coil 104 to the chamber shield 106 (which is typically grounded).

RF power is applied to the coil 104 by feedthrough bolts which are supported by insulating feedthrough standoffs 124 (FIG. 1). The feedthrough standoffs 124, like the coil support standoffs 120, permit repeated deposition of conductive material from the target onto the feedthrough standoff 124 without the formation of a conducting path which could short the coil 104 to the chamber shield 106. The coil feedthrough standoff 124, like the coil support standoff 120, has an internal labyrinth structure to prevent the formation of a short between the coil 104 and the wall 126 of the shield. The feedthrough is coupled to the RF generator 304 (shown schematically in FIG. 3) through the matching network 302 (also shown schematically in FIG. 3).

One end of the coil 204 is coupled to an RF source such as the output of an amplifier and matching network 602, the input of which is coupled to an RF generator 604. The other end of the coil 204 is coupled to ground, preferably through a capacitor 606, which may be a variable capacitor.

The coil 204 may be supported by RF feedthrough assemblies 205 (FIG. 2) mounted in a central lid 206 of vacuum chamber 102 and suspended through a central opening 208 of annular magnetron 116 and a central opening 210 of conical frustrum target 110 (shown schematically in FIG. 3). The feedthrough assemblies 205 insulate the RF coil 204 from the vacuum chamber lid 206. Like the RF feedthroughs 124 for the coil 104, the RF feedthroughs 205 for the coil 204 may have an internal labyrinth structure to prevent the deposition of conductive material onto the feedthrough from forming a short between the coil 204 and the chamber lid 206. The chamber lid 206 may be sealingly carried by an adapter ring assembly 213 which sealingly mates with the magnetron housing as shown or alternatively may mate directly with the target 110. However, since the target is negatively biased, the adapter assembly 213 should insulate the target from the chamber lid 206.

As best seen in FIG. 2, the coil 204 is positioned in a cavity 214 formed in the interior of the frusto-conically shaped target 110. The coil 204 is preferably positioned in such a manner as to improve the uniformity of the density of the plasma 118 and to provide the desired plasma density across the target surface in conjunction with the ionization also being provided by the coil 104 and the magnetron 116. In addition, it is desired that the coil 204 be positioned to the extent possible to reduce the deposition of target material onto the coil 204. In the example shown, the coil 204 is positioned between the coil 104 and the target 110 and below the aperture 210 of the target 110.

In the illustrated embodiment, the coil 204 is a multi-turn coil in which each turn of the coil defines a face as represented by plane 216. Each turn is preferably centered with respect to the chamber axis 300 and oriented to face toward the center of the plasma generation area 118 to increase the density of the plasma in this center region. In addition, to concentrate the effect of the coil 204 on the center region of the plasma generation area 118, it is preferred that the outer diameter 218 (FIG. 3) of the coil 204 be substantially smaller than the inner diameter 220 of the coil 104. As a result, the coil 204 is closer to the plasma center region than is the coil 104.

Figure 4:
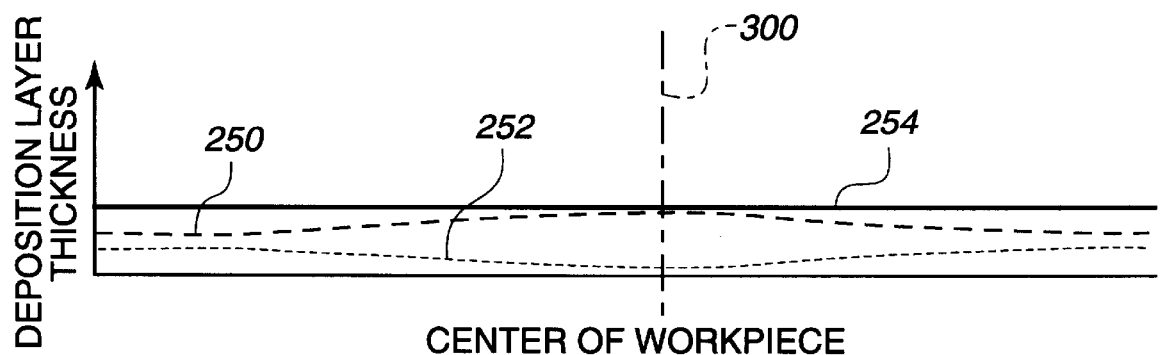
FIG. 4 is a chart depicting the respective deposition profiles for material deposited from the target of the plasma-generating chambers of FIGS. 1–2 due to the RF power applied to the coils and the DC power bias of the target.

As previously mentioned, material sputtered by that portion of the ion flux 108 which is generated by the action of the magnetron 116, has a tendency to deposit more heavily in the center of the substrate, as represented by the line 250 in FIG. 4. To compensate for this center deposition tendency, the target may be shaped to have a conical frustrum cross-section as shown in FIGS. 1 and 2. It is believed that by spacing the central region of the target 110 farther from the substrate 112 than the periphery of the target 110 is spaced from the substrate 112, uniformity of the deposition can be improved. Deposition uniformity may also be improved by adjusting the ratio of the RF power supplied to the coils 104 and 204 relative to the DC power applied to the target 110. As best seen in FIG. 2, the higher density regions of the plasma 118 generated by the coil 104 are closer to the peripheral region 128 of the target 110 as compared to the central region of the target 110, because of the conical frustrum shape of the target 110. In addition, the density of the plasma 118 tends to decrease with distance from the coil 104. As a consequence, the density of ions contributed to the ion flux 108 by the plasma 118 is believed to be greater adjacent the target 110 periphery as compared to the central region of the target 110 which is more displaced from the plasma 118. Hence, any etching of the target 110 resulting from ions contributed by the plasma 118 is believed to be directed primarily to the peripheral region of the target 110 rather than the central region of the target 110.

Sputtering of the target 110 periphery tends to deposit material more heavily towards the periphery of the substrate 112 as compared to the center. As a consequence, material deposited on the substrate 112 as a result of material sputtered from the target 110 by ions contributed by the plasma 118 are believed to likewise preferentially deposit adjacent the periphery of the substrate 112 as represented by the deposition profile 252 of FIG. 4. Because the deposition profiles 250 and 252 tend to be complementary, the tendency of material sputtered by magnetron-induced ions to deposit more thickly toward the center of the substrate 112 can be offset by the opposite tendency of material sputtered by coil-induced ions of the plasma 118, to deposit more thinly toward the substrate 112 center and vice versa. As a result, the actual overall deposition profile 254 which is a combination of the deposition profiles 250 and 252 can be more uniform than the deposition profile 250 alone.

Thus, an increase in the RF power supplied to the coil 104 relative to the DC power applied to the target 110 can increase the relative proportion of ions contributed by the plasma 118 to the ion flux striking the target, and thereby increase the relative thickness of target material deposited toward the periphery of the substrate 112, as shown schematically by the deposition profile 252 in FIG. 4. Conversely, a decrease in the RF power supplied to the coil 104 relative to the DC power applied to the target 110 can reduce the relative proportion of ions contributed by the plasma 118 to the ion flux striking the target, which tends to increase the relative thickness of target material deposited toward the center of the substrate 112, as shown schematically by the deposition profile 250 in FIG. 4.

In accordance with the present invention, adjustments to the density profile of the plasma 118 are facilitated by adjusting the RF power level to the second central coil 204. More specifically, by appropriately adjusting the ratio of RF power level applied to the coils 104 and 204 to the DC power level of the bias applied to the target 110, it is believed that the non-uniformity of the deposition profile 252 of the material sputtered by the ions of the RF coil 104 and 204 can be selected in such a manner as to substantially compensate for the non-uniformity of the deposition profile 250 of the DC magnetron-sputtered material from the target 110 such that the overall deposition profile 254 of the layer from both sources of sputtered material can be substantially more uniform than that which has often been obtained from a target by DC magnetron sputtering alone.

Thus, it is presently believed that the amount of sputtering which originates from the target 110 by RF-induced sputtering from ions provided by two separate coils, as compared to the amount of sputtering which originates from the target 110 by magnetron-induced sputtering is a function of the RF power applied to the coils 104 and 204 relative to the DC power applied to the target 110. By adjusting the ratio of the overall coil RF power to the target DC power, the relative amounts of material sputtered from the target 110 by the different sources of ions may be varied so as to achieve improved uniformity.

As shown in FIG. 5, it is believed that a particular ratio of the coil RF power to the target DC power may achieve a minimal degree (represented for convenience as "0%") of non-uniformity of the layer of material deposited from the target 110. As discussed above, when the RF power levels to the coils 104 and 204 are increased relative to the DC power applied to the target 110, the deposited layer tends to be more edge-thick as represented by the increasingly negative percentage of non-uniformity as shown in FIG. 5. In the sign convention of FIG. 5, an edge-thick non-uniformity was chosen to be represented by a negative percentage of non-uniformity and a center-thick non-uniformity was chosen to be represented by a positive percentage of non-uniformity. The larger the absolute value of the percentage non-uniformity, the greater the degree of non-uniformity (either edge-thick or center-thick) represented by that percentage. Conversely, by decreasing the ratio of the RF power to the coils 104 and 204 relative to the DC power applied to the target 110, the center of the deposited layer tends to grow increasingly thicker relative to the edges as represented by the increasingly positive percentage of non-uniformity.

Thus, by adjusting the ratio of the RF power to the coil 104 relative to the DC power biasing the target 110 and the relative RF power levels between the coils 104 and 204, the material sputtered by RF-induced sputtering from the target can be increased or decreased as appropriate to more effectively compensate for non-uniformity of the material sputtered by magnetron-induced sputtering from the target 110 to achieve a more uniform deposited layer. For example, for a single turn coil 104 and a planar spiral coil 204, a coil 104 RF power to target DC power ratio may be approximately 2.5:6 and a coil 204 RF power to target ratio may be approximately 1:6. The degree of non-uniformity is preferably less than 10% and is more preferably less than 5% and still more preferably less than 1%. The optimal power ratios will vary depending upon the particular application including the particular sizes of the chamber, coils, target and substrate, their relative spacings, sputter gas pressure, sputter material and other variables well known to those skilled in the art. For example, the substrate 112 to target 110 spacing may be in a range of about 100–150 mm, preferably about 125 mm (about 5"), but can also range from about 1.5" to 8" (4 cm to 20 cm). For this substrate 112 to target 110 spacing, a coil 104 having a diameter of 16 inches (40 cm) may be spaced from the target 110 by a distance of 1.9 inches (5 cm), for example.

As previously mentioned, for a nitrogen/argon ($N_2$/Ar) plasma, the electron density of that portion of the high density plasma 118 which is generated by RF power supplied to the coil 104 has a tendency to be greater in the periphery of the high density plasma 118 as represented by the line 352 in FIG. 6, where radial distance r from a center of the high density plasma 118 is plotted against the electron density n of the high density plasma 118. To compensate for this peripheral density tendency, in accordance with the present invention, density uniformity can be improved by adjusting the ratio of the RF power supplied to the coil 104 relative to the RF power supplied to the coil 204. The electron density of that portion of the high density plasma 118 which is generated by RF power supplied to the coil 204 has a tendency to be greater in the center of the high density plasma 118 as represented by the line 350 in FIG. 6. Because the deposition profiles 350 and 352 tend to be complementary, the tendency of electrons generated by the coil 104 to be densest toward the periphery of the plasma 118 can be offset by the opposite tendency of electrons generated by the coil 204 to be densest toward the center of the plasma 118 and vice versa. As a result, the actual overall density profile 354 which is a combination of the density profiles 350 and 352 can be more uniform than the density profile 352 alone.

Thus, an increase in the RF power supplied to the coil 204 relative to the RF power supplied to the coil 104 can increase the relative proportion of electrons contributed by the coil 204 to the plasma 118, and thereby increase the relative density of free electrons remaining uncombined toward the center of the plasma 118, as shown schematically by the density profile 350 in FIG. 6. Conversely, a decrease in the RF power supplied to the coil 204 relative to the RF power supplied to the coil 104 can reduce the relative proportion of free electrons remaining uncombined toward the center of the plasma 118, which tends to increase the relative density of free electrons remaining uncombined toward the periphery of the plasma 118, as shown schematically by the density profile 352 in FIG. 6.

Recombination of free electrons in the high density plasma 118 with atoms or molecules in the sputter gas may be particularly problematic when an argon/nitrogen (Ar/$N_2$)

sputter gas atmosphere is used, for example, so that ionized titanium may react with nitrogen on the surface of the substrate 112 in order to form TiN. The electrons may recombine with ionized nitrogen much more frequently than with ionized argon.

By appropriately adjusting the ratio of the RF power level applied to the coil 104 to the RF power level applied to the coil 204, it is believed that the non-uniformity of the density profile 352 of the free electrons generated by the RF coil 104 can be selected in such a manner as to substantially compensate for the non-uniformity of the density profile 350 of the free electrons generated by the RF coil 204. As a result, the overall density profile 354 of the free electron density from both sources of free electron generation can be substantially more uniform as represented by density profile 354, than that which has often been obtained from the coil 104 alone.

Thus, it is presently believed that the free electron density which originates from the coil 104 by RF-induction as compared to the free electron density which originates from the coil 204 by RF-induction is a function of the RF power applied to the coil 104 relative to the RF power applied to the coil 204. By adjusting the ratio of the coil 104 RF power to the coil 204 RF power, the relative free electron densities from the coils 104 and 204 may be varied so as to achieve improved plasma density uniformity.

For example, for a single turn coil 104, a coil 104 RF power to coil 204 RF power ratio of approximately 3 to 1 (1.5 kW to 0.5 kW) is believed to improve uniformity of plasma density. The degree of non-uniformity is preferably less than 10% and is more preferably less than 5% and still more preferably less than 1%. The optimal power ratio will vary depending upon the particular application including the particular sizes of the chamber, coils, target and substrate, their relative spacings, sputter gas pressure, sputter material and other variables well known to those skilled in the art. For example, as discussed above, the substrate 112 to target 110 spacing may be in a range of about 100–150 mm, preferably about 125 mm (about 5"), but can also range from about 1.5" to 8" (4 cm to 20 cm). For this substrate 112 to target 110 spacing, a coil 104 diameter of 16 inches (40 cm) may be spaced from the target 110 by a distance of 1.9 inches (5 cm), for example.

As set forth in copending application Ser. No. 08/680,335, filed Jul. 10, 1996, entitled "Coils for Generating a Plasma and for Sputtering" material may also be sputtered from a coil onto the substrate 112 to supplement the material which is being sputtered from the target 110 onto the substrate 112. As a result, the layer deposited onto the substrate 112 may be formed from material from both the coils 104 and 204 and the target 110 which can further substantially improve the deposition uniformity of the resultant layer.

It is presently believed that the amount of sputtering which originates from the coils 104 and 204 as compared to the sputtering which originates from the target 110 is also a function of the RF power applied to the coils 104 and 204 relative to the DC power applied to the target 110. By adjusting the ratio of the coil 104 RF power and/or the coil 204 RF power to the target 110 DC power, the relative amounts of material sputtered from the coils 104 and/or 204 and the target 110 may be varied so as to improve uniformity.

The target 110 generally has the shape of a hollow frustrum of a cone. Preferably, the surface of the target 110 may make an angle of about 35° with a plane defined by the surface of the substrate 112. A range of angles from about 30° to about 40° may also be used. However, other shapes are also possible such as an annular disk-shaped target. Still other design shapes for the target 110 are, of course, possible, and may lead to different deposition profiles for the material deposited from the target 110 onto the substrate 112. For example, a secondary annular target (of titanium, aluminum or other suitable materials) may be positioned around the periphery of the substrate 112, to supplement the material being sputtered from a primary planar target onto the substrate, with the primary planar target positioned above the substrate. Each target which is negatively biased should be electrically insulated from the vacuum chamber 102 which is typically grounded.

The coil 104 of the embodiment illustrated in FIGS. 1–2 may be made of 2 inch by 1/16 inch (5 cm by 1.4 mm) heavy-duty bead-blasted solid high-purity (preferably 99.995% pure) titanium or copper ribbon formed into a multiple turn helical coil having a diameter of about 16 inches (40 cm). The coil 204 of the embodiment illustrated in FIGS. 1–2 may be made of 2 inch by 1/16 inch (5 cm by 1.4 mm) heavy-duty bead-blasted solid high-purity (preferably 99.995% pure) titanium or copper ribbon formed into a flat spiral multiple turn coil having an outer diameter of about 8 inches (20 cm). However, other highly conductive materials and shapes may be utilized depending upon the material being sputtered and other factors. For example, the ribbon of the coils 104 and/or 204 may be as thick as 1/8 inch (3 mm). Also, if the material to be sputtered is aluminum, both the target and the coils 104 and 204 should be made of high-purity aluminum. In addition to the ribbon shape illustrated for coil 104, hollow tubing may be utilized, also for coil 204, particularly if water cooling is desired.

Several of the embodiments discussed above utilized a coil 104 having multiple turns (e.g., 3 turns) in the plasma chamber 100. The advantage of a multiple turn peripheral RF coil is that the required current levels can be substantially reduced for a given RF power level. However, multiple turn coils tend to be more complicated and hence most costly and difficult to clean as compared to single turn coils. It should be recognized that the present invention is also applicable to plasma chambers having a single turn peripheral RF coil 104. It should also be recognized that the present invention is applicable to plasma chambers having more than two RF powered coils. For example, the present invention may be applied to multiple coil chambers for launching helicon waves of the type described in copending application Ser. No. 08/559,345, filed Nov. 15, 1995 for "Method and Apparatus for Launching a Helicon Wave in a Plasma" which is assigned to the assignee of the present application.

The appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz but it is anticipated that the range can vary from, for example, 1 MHz to 4 MHz. An RF power setting of 3.5 kW is preferred for coil 104 but a range of 1.5–5.0 kW is satisfactory. An RF power setting of 1.2 kW is preferred for coil 204, but a range of 1.0–2.0 kW is satisfactory. In addition, a DC power setting for biasing the target 110 of 5.0 kW is preferred but a range of 3.0–8.0 kW and a pedestal 114 bias voltage of –30 volts DC is satisfactory.

In the illustrated embodiments above, the chamber shield 106 has a diameter of 16", but it is anticipated that satisfactory results can be obtained with a diameter in the range of 13"–25". The chamber shield 106 may be fabricated from a variety of materials including insulative materials such as ceramics or quartz. However, the chamber shield 106 and all metal surfaces likely to be coated with the target material are preferably made of a material such as stainless steel or copper, unless made of the same material as the sputtered target material. The material of the structure which will be coated should have a coefficient of thermal expansion which closely matches that of the material being sputtered to reduce flaking of sputtered material from the chamber shield 106 or other structure onto the substrate 112. In addition, the material to be coated should have good adhesion to the sputtered material. Thus for example if the deposited material is titanium, the preferred metal of the chamber shield 106, standoffs 120 and 124 and other structures likely to be coated is bead-blasted titanium. Any surfaces which are more likely to sputter, such as the end caps of the coil feedthrough and standoffs 205, 120 and 124, would preferably be made of the same type of material as the target 110, such as high-purity, bead-blasted titanium, for example. Of course, if the material to be deposited is a material other than titanium, the preferred metal is the deposited material.

As discussed above, the substrate 112 to target 110 spacing may be in a range of about 100–150 mm, preferably about 125 mm (about 5"). For this substrate 112 to target 110 spacing, improved stepped substrate 112 bottom coverage has been achieved with a coil 104 diameter of 16 inches (40 cm) spaced from the target 110 by a distance of 1.9 inches (5 cm). It has been found that increasing the diameter of the coil 104 which moves the coil 104 away from the substrate 112 edge has an adverse effect on bottom coverage. On the other hand, decreasing the coil 104 diameter to move the coil 104 closer to the substrate 112 edge can adversely effect layer deposition uniformity.

Deposition uniformity also appears to be a function of coil 104 spacing from the target 110. As previously mentioned, a spacing of 1.9 inches (5 cm) between the coil 104 and target 110 has been found desirable for a substrate 112 to target 110 spacing of 125 mm. Moving the coil 104 vertically either toward or away from the target 110 (or substrate 112) can adversely effect layer deposition uniformity.

A variety of precursor gases may be utilized to generate the plasma including Ar and Ar/N$_2$. Various precursor gas pressures are suitable including pressures of 0.1–50 mTorr. For ionized PVD, a pressure between 10 mTorr and 50 mTorr, such as 30 mTorr, can provide suitable ionization of sputtered material.

It will, of course, be understood that modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. An apparatus for energizing a plasma within a semiconductor fabrication system and for sputtering material onto a substrate, the apparatus comprising:

a semiconductor fabrication chamber having a substrate support, a target having an axis extending to said substrate support, and a plasma generation region adjacent to said target and having a central region centered on said axis;

a first RF coil positioned to couple RF energy into said plasma generation region to ionize sputtered material; and a second RF coil having at least one turn positioned to couple RF energy into said central region of said plasma generation region wherein at least a portion of said turn is positioned between said axis and said target.

2. The apparatus of claim 1 wherein said second coil is spiral shaped.

3. The apparatus of claim 1 wherein said second coil is a generally planar multi-turn coil.

4. The apparatus of claim 1 wherein said second coil is centrally positioned between said first coil and said target.

5. The apparatus of claim 1 wherein said first coil is carried by said chamber and positioned at a periphery of said plasma generation region.

6. The apparatus of claim 1 wherein said first coil is helix-shaped.

7. The apparatus of claim 1 wherein said target has a hollow frusto-conical shape.

8. The apparatus of claim 7 wherein said target defines a cavity and said second RF coil is positioned within said cavity.

9. The apparatus of claim 1 wherein said first RF coil substantially surrounds said plasma generation region and said second RF coil has at least one turn which defines a face oriented toward said plasma generation area central region.

10. The apparatus of claim 1 wherein said first RF coil defines an inner diameter and said second RF coil defines an outer diameter which is less than said first RF coil inner diameter.

11. The apparatus of claim 1 wherein said second RF coil is a spiral-shaped coil facing toward said plasma generation area central region.

12. The apparatus of claim 1 wherein said first RF coil is a single-turn, open ring-shaped coil.

13. The apparatus of claim 1 further comprising an RF power source and wherein said target defines an aperture and said second RF coil is coupled to said RF power source through said target aperture.

14. The apparatus of claim 1 further comprising:

a first source for applying a DC bias to said target at a first power level;

a first RF generator for applying RF power to said first RF coil at a second power level; and a second RF generator for applying RF power to said second RF coil at a third power level.

15. The apparatus of claim 1 wherein said first RF coil is carried internally within said chamber.

16. An apparatus for energizing a plasma within a semiconductor fabrication system having a magnetron to produce ions to sputter material from a target onto a substrate supported by a support, said target having an axis extending from said target to said support, the apparatus comprising:

power source coupled to said target to supply power to said target;

a semiconductor fabrication chamber having a plasma generation region adjacent to said target and having a central region centered on said axis;

a first RF coil carried internally within said chamber and positioned at a periphery of said plasma generation region to couple RF energy into said plasma generation region at a first power level, to produce ions to ionize said sputtered material;

a first RF generator coupled to said first RF coil to provide RF power to said first RF coil;

a second RF coil having at least one turn carried by said chamber and positioned centrally in said chamber adjacent said central region of said plasma generation region and below said target to couple RF energy into said central region of said plasma generation region at a second power level, wherein at least a portion of said turn is positioned between said axis and said target; and a second RF generation coupled to said second RF coil to provide RF power to said second RF coil.

17. A method of sputter depositing material on a substrate supported by a support, the method comprising:

biasing a target having an axis extending to said support, to attract ions to sputter material from said target;

applying RF power to a first RF coil positioned to couple RF energy into a plasma to produce ions to ionize sputtered material; and applying RF power to a second RF coil having at least one turn positioned to couple RF energy into a central region centered on said axis of said plasma wherein at least a portion of said turn is positioned between said axis and said target.

18. The method of claim 17 wherein said second coil is spiral shaped.

19. The method of claim 17 wherein said second coil is a generally planar multi-turn coil.

20. The method of claim 17 wherein said second coil is centrally positioned between said first coil and said target.

21. The method of claim 17 wherein said first coil is carried by said chamber and positioned at a periphery of said plasma generation region.

22. The method of claim 17 wherein said first coil is helix-shaped.

23. The method of claim 17 wherein said target has a hollow frusto-conical shape.

24. The method of claim 17 wherein said target defines a cavity and said second RF coil is positioned within said cavity.

25. The method of claim 17 wherein said first RF coil substantially surrounds said plasma generation region and said second RF coil has at least one turn which defines a face oriented toward said plasma generation area central region.

26. The method of claim 17 wherein said first RF coil defines an inner diameter and said second RF coil defines an outer diameter which is less than said first RF coil inner diameter.

27. The method of claim 17 wherein said second RF coil is a spiral-shaped coil facing toward said plasma generation area central region.

28. The method of claim 17 wherein said first RF coil is a single-turn, open ring-shaped coil.

29. The method of claim 17 wherein said first and second RF coils include a coil material, and said target material and said coil material are the same type of material.

30. The method of claim 17 wherein said first RF coil is carried internally within said chamber.

* * * * *